(12) United States Patent
Zhou

(10) Patent No.: US 9,786,373 B2
(45) Date of Patent: Oct. 10, 2017

(54) EEPROM BACKUP METHOD AND DEVICE

(71) Applicant: SEMICONDUCTOR MANUFACTURING INTERNATIONAL (SHANGHAI) CORPORATION, Shanghai (CN)

(72) Inventor: Shicong Zhou, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/466,503

(22) Filed: Mar. 22, 2017

(65) Prior Publication Data
US 2017/0194054 A1 Jul. 6, 2017

Related U.S. Application Data

(62) Division of application No. 14/881,110, filed on Oct. 12, 2015, now Pat. No. 9,659,661.

(30) Foreign Application Priority Data

Oct. 13, 2014 (CN) .......................... 2014 1 0538372

(51) Int. Cl.
G11C 11/34 (2006.01)
G11C 16/14 (2006.01)
G11C 16/10 (2006.01)
G06F 3/06 (2006.01)

(52) U.S. Cl.
CPC ............ *G11C 16/14* (2013.01); *G06F 3/0608* (2013.01); *G06F 3/0652* (2013.01); *G06F 3/0679* (2013.01); *G11C 16/10* (2013.01)

(58) Field of Classification Search
CPC ................................ G11C 16/14; G11C 16/10
USPC ............ 365/185.29, 185.03, 185.11, 185.19, 365/185.22
See application file for complete search history.

(56) References Cited

U.S. PATENT DOCUMENTS 8,984,242 B2 * 3/2015 Kim ...................... G06F 9/4418
711/162

* cited by examiner

*Primary Examiner* — Fernando Hidalgo
(74) *Attorney, Agent, or Firm* — Kilpatrick Townsend & Stockton LLP

(57) ABSTRACT

An electrically erasable programmable read-only memory (EEPROM) device includes a plurality of data areas in the EEPROM associated with a corresponding plurality of memory addresses, respectively, a data status indicator associated with each of the plurality of data areas. The data status indicator is configured to indicate that a data area is in an erase state, an uncertain state, or a valid state. The EEPROM device also includes a controller. A first data area and a second data area are configured to be a backup storage area for each other. In an erase and program cycle, at least one of the first or second memory areas is in a valid state throughout the erase and program cycle. Further, in an erase and program cycle, an erase operation is performed in one of the first or second memory areas, and a program operation is performed in the other data areas.

8 Claims, 6 Drawing Sheets

EEPROM BACKUP METHOD AND DEVICE

CROSS-REFERENCES TO RELATED APPLICATIONS

This application is a divisional application of U.S. application Ser. No. 14/881,110, filed on Oct. 12, 2015, which claims priority to Chinese patent application No. 201410538372.1, filed on Oct. 13, 2014, the content of which is incorporated herein by reference in its entirety.

BACKGROUND OF THE INVENTION

The present invention relates to the field of electronic circuit technology; specifically it relates to a method and device for operating an EEPROM (Electrically Erasable Programmable Read-only Memory).

In an electrical erasable programmable read-only memory (EEPROM), a data is stored in an erase and program cycle including an erase operation and a program operation in a data area pointed to by the same address. FIG. 1 is a diagram illustrating data status in an erase and program cycle. As shown in FIG. 1, before the erase operation is started, the data status is in a valid state. During the erase operation, the data status is indeterminate or uncertain. When the erase operation is completed, the data status is in an erased state. At this time, a program operation is started to write new data in the data area, and the data status is indeterminate or uncertain. When the program operation is completed, the data status becomes a valid state. In the operation illustrated in FIG. 1, the data can be lost, if the erase or program operation is interrupted when the data status is uncertain or erased.

In order to prevent data loss, a backup mechanism is often employed, in which a target data area and a backup data area are used to store the same data. If the data in the target area is corrupted, the backup data area can be used to restore the data. FIG. 2 is a diagram illustrating a data storage method in a conventional backup system. In this example, data area #1 is used as a target data area, and data area #2 is used as a backup data area. The erase and program operations in each erase and program cycle in both data areas are the same as those described above in connection to FIG. 1. In FIG. 2, when an erase and program cycle is finished in data area #1, the system performs a second erase and program cycle in the backup data area to store the same data. It can be seen that, during erase-program cycle #2, the data in data area 1 is valid, with data #1 stored therein. Similarly, in the next erase and program cycle, erase-program cycle #3, new data, e.g., data #2, will be written in data area 1. During erase-program cycle #3, the data in data area #2 is valid. Therefore, if an operation is interrupted and the data status is either uncertain or erased, a valid data is available in one of the two data areas.

BRIEF SUMMARY OF THE INVENTION

The inventor has observed that the conventional data backup method described above is time consuming and costly. Embodiments of the present invention provide a method and device EEPROM backup operation. In an EEPROM, a first data area and a second data area are configured to be a backup data storage area to each other. In each erase and program cycle, each data area is in either an erase operation or a program operation, and at least one of the two data areas is in a data valid state.

According to some embodiments of the present invention, a method for operating an electrically erasable programmable read-only memory (EEPROM) includes providing a plurality of data areas in the EEPROM associated with a corresponding plurality of memory addresses, respectively. During an erase operation, a data area is in an uncertain state and after completion of the erase operation, the data area is in an erased state. During a program operation, the data area is in an uncertain state, and after completion of the program operation, the data area is in a valid state. The method also includes the following processes in a first erase and program cycle:
- determining that a first data area is in an erased state and a second data area is in a valid state;
- performing a program operation to store a first data in the first data area;
- after completion of the program operation, setting the first data area to a valid state, and performing an erase operation in the second data area; and
- after completion of the erase operation, setting the second data area to an erased state.

In an embodiment, the method also includes the following processes in a second erase and program cycle after the first erase and program cycle:
- performing a program operation to store a second data in the second data area;
- after completion of the program operation, setting the second data area to a valid state, and performing an erase operation in the first data area; and
- after completion of the erase operation, setting the first data area to an erased state.

In an embodiment, the method also includes determining that both first and second data areas are in a valid state, examining a sequence number in each of the first and second data areas to select one of the first or second data areas, and performing an erase operation in the selected data area.

In an embodiment, the method also includes determining that an operation in a data area is not completed and that the data area is not in an erased state, and performing an erase operation in that data area.

In an embodiment, the method also includes determining if an erase operation or programming operation is completed.

In an embodiment, the first data area and the second data area are each configured to be a backup data storage area to each other.

According to some embodiments of the present invention, an electrically erasable programmable read-only memory (EEPROM) device includes a plurality of data areas in the EEPROM associated with a corresponding plurality of memory addresses, respectively, a data status indicator associated with each of a plurality of data areas. The data status indicator is configured to indicate that a data area is in an erase state, an uncertain state, or a valid state. The EEPROM device also includes a controller. In the EEPROM device, a first data area and a second data area are configured to be a backup storage area for each other. In an erase and program cycle, at least one of the first or second memory areas is in a valid state throughout the erase and program cycle. Further, in an erase and program cycle, an erase operation is performed in one of the first or second memory areas, and a program operation is performed in the other data areas.

In an embodiment of the above EEPROM device, the EEPROM device is configured such that, during an erase operation, a data area is in an uncertain state and after completion of the erase operation, the data area is in an erased state, and during a program operation, the data area is in an uncertain state and after completion of the program operation, the data area is in a valid state. The EEPROM device is further configured to, in a single erase and program cycle, perform a program operation in a first data area that is in an erase state and after the program operation is completed, perform an erase operation in a second data area that is in a valid state.

In an embodiment, the EEPROM device is configured to perform the following operations, in a first erase and program cycle:
- determining that a first data area is in an erased state and a second data area is in a valid state;
- performing a program operation to store a first data in the first data area;
- after completion of the program operation, setting the first data area to a valid state, and performing an erase operation in the second data area; and
- after completion of the erase operation, setting the second data area to an erased state.

In an embodiment, the EEPROM device is configured to perform the following operations, in a second erase and program cycle after the first erase and program cycle:
- performing a program operation to store a second data in the second data area;
- after completion of the program operation, setting the second data area to a valid state, and performing an erase operation in the first data area; and
- after completion of the erase operation, setting the first data area to an erased state.

In an embodiment, the EEPROM device also includes a sequence number associated with each of a plurality of data areas, and the EEPROM device is configured to perform the following operations:
- determining that both first and second data areas are in a valid state;
- examining the sequence number in each of the first and second data areas to select one of the first or second data areas; and
- performing an erase operation in the selected data area.

In an embodiment, the EEPROM device is configured to perform the following operations:
- determining that an operation in a data area is not completed and that data area is not in an erased state; and
- performing an erase operation in that data area.

In an embodiment, the EEPROM device is configured to determine if an erase operation or programming operation is completed.

According to some embodiments of the present invention, an electrically erasable programmable read-only memory (EEPROM) device includes a plurality of data areas in the EEPROM associated with a corresponding plurality of memory addresses, respectively. The EEPROM device also includes a data status indicator associated with each of the plurality of data areas, and the data status indicator is configured to indicate that a data area is in an erase state, an uncertain state, or a valid state. The EEPROM device also includes a sequence number associated with each of the plurality of data areas and a controller. The EEPROM device is configured such that, during an erase operation, a data area is in an uncertain state and after completion of the erase operation, the data area is in an erased state, and during a program operation, the data area is in an uncertain state and after completion of the program operation, the data area is in a valid state. The EEPROM device is further configured to, in a single erase and program cycle, perform a program operation in a first data area that is in an erase state, and after the program operation is completed, perform an erase operation in a second data area that is in a valid state. Further, the EEPROM is configured such that at least one of the first or second memory areas is in a valid state throughout the single erase and program cycle.

The following description, together with the accompanying drawings, will provide further understanding of the nature and advantages of the claimed invention.

DETAILED DESCRIPTION OF THE INVENTION

Various embodiments of the present invention are described below. It should be noted that, when appropriate, the exemplary embodiments and features can be combined with each other.

In some embodiments, in an EEPROM, a first data area and a second data area are configured to be a backup data storage area to each other. In each erase and program cycle, each data area is in either an erase operation or a program operation, and at least one of the two data areas is in a data valid state.

Figure 1:
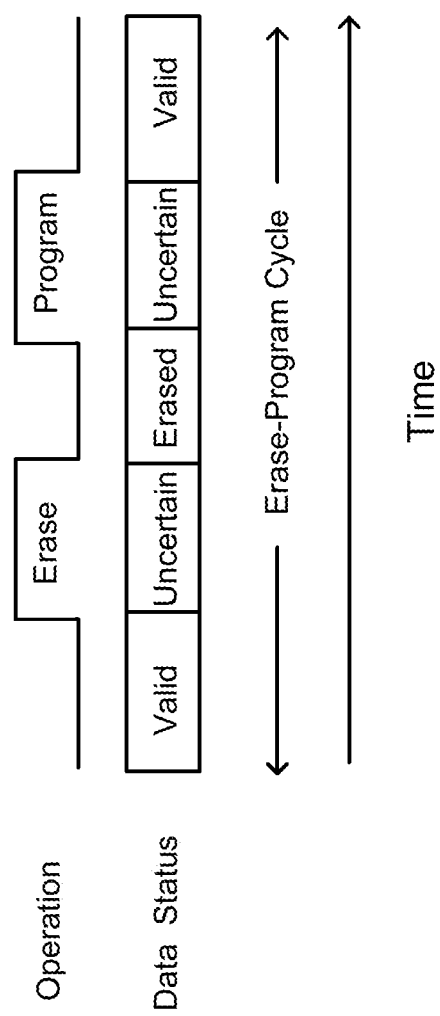
FIG. 1 is a diagram illustrating a write operation in a conventional EEPROM.
Figure 2:
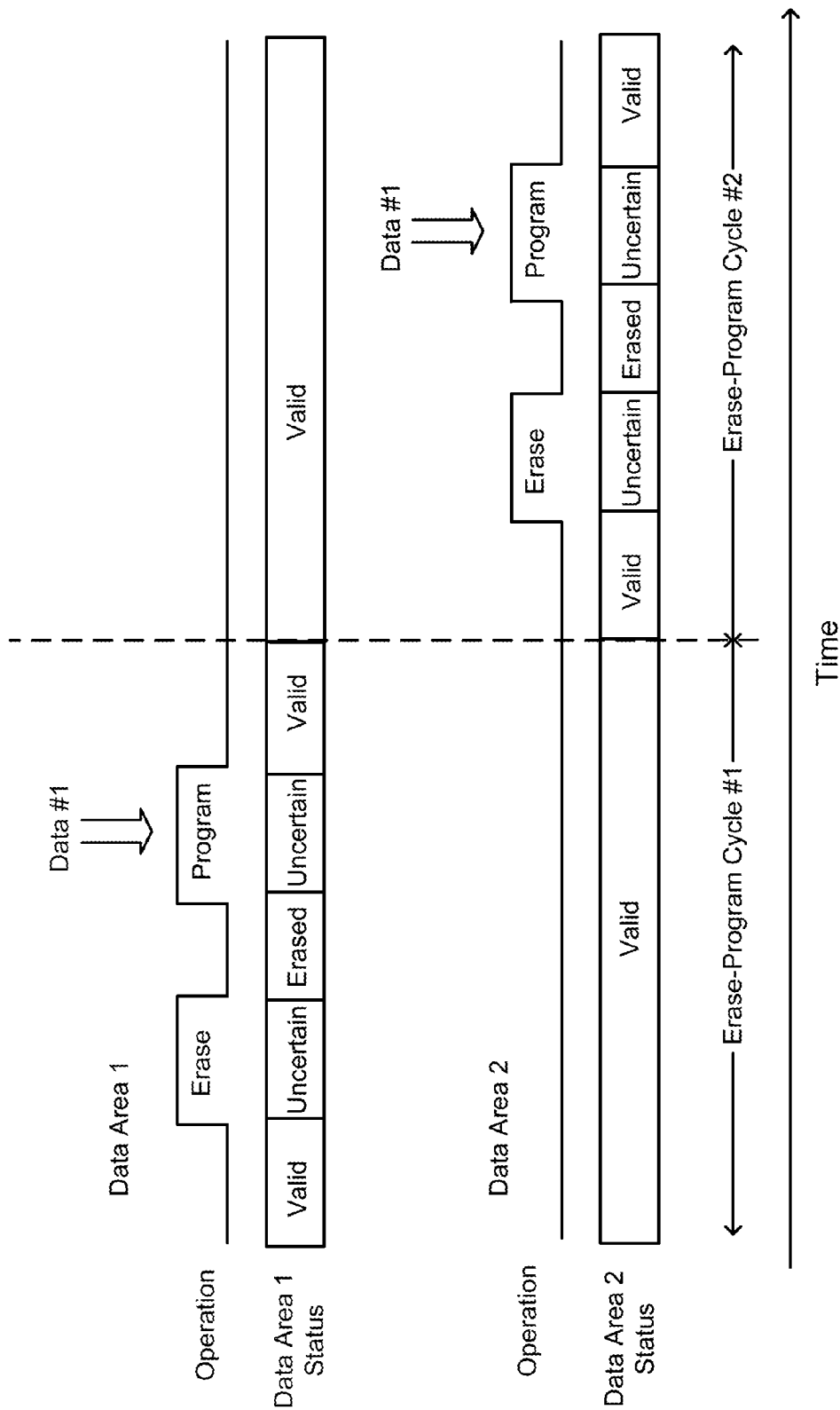
FIG. 2 is a diagram illustrating a program and backup operation in a conventional EEPROM.
Figure 3:
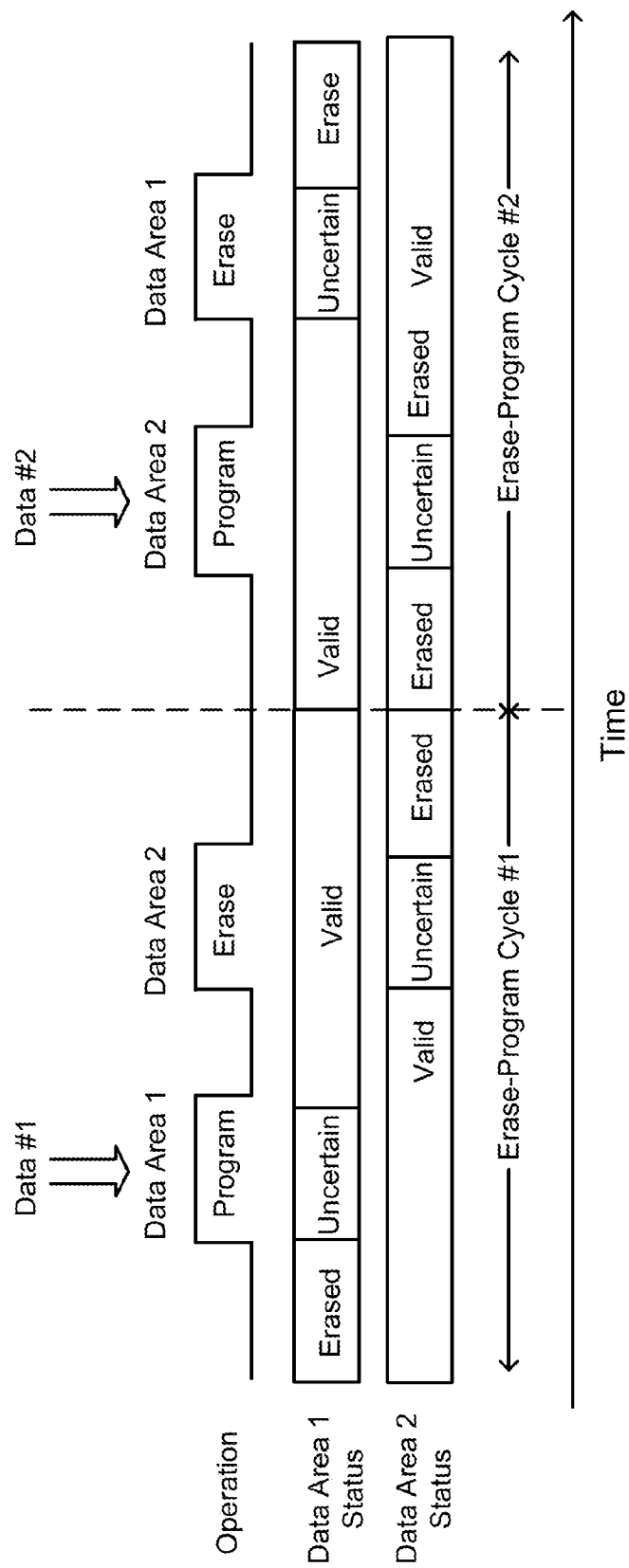
FIG. 3 is a diagram illustrating a program and backup operation in an EEPROM according to an embodiment of the present invention.

FIG. 3 is a diagram illustrating a storage and backup operation in an EEPROM according to an embodiment of the present invention. As shown in FIG. 3, data area 1 and data area 2 are configured to be a backup storage area for each other. In erase-program cycle #1, a program operation is performed to store data into data area 1. After the program operation is finished, the data is in a valid state in data area 1. Then, an erase operation is performed in data area 2. Note that, in the beginning of erase-program cycle #1, data area 1 is in an erased state, and data area 2 is in a valid state. Further, data area 1 is in a valid state, when data area 2 undergoes the erase operation. Note that, in some embodiments, the system includes a data completion test module for determining whether a data area is in an uncertain state or a valid state. The module can be configured to determine if a program operation is completed to determine if the data is valid.

In FIG. 3, in erase-program cycle #2, a program operation is performed to store data into data area 2. After the program operation is finished, the data is in a valid state in data area 2. Then, an erase operation is performed in data area 1. Note that in the beginning of erase-program cycle #2, data area 2 is in an erased state after having been erased in a pervious cycle, and data area 1 is in a valid state after being programmed in the previous cycle. Further, data area 2 is in a valid state, when data area 1 undergoes the erase operation.

As described above, one of the data areas is always in a valid state, when the other data area is undergoing a program or an erase operation. Only one erase and program cycle is needed to update the data once. In contrast, in the conventional method, two erase and program cycles are needed to store a new data and back it up.

Figure 4:
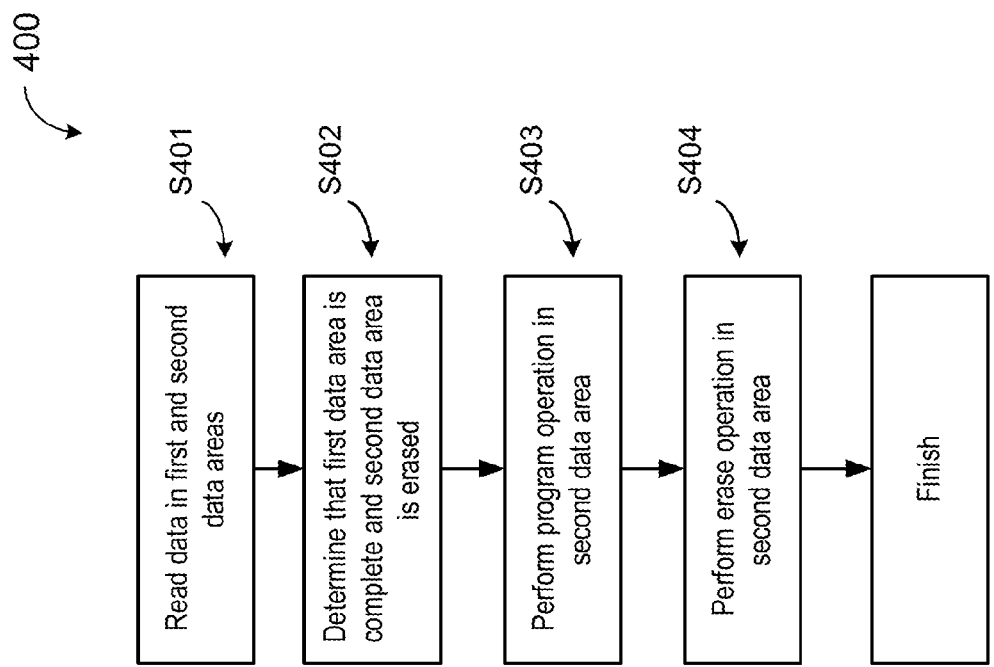
FIG. 4 is a flowchart illustrating a data storage method according to an embodiment of the present invention.

FIG. 4 is flowchart illustrating a data storage method according to an embodiment of the present invention. As shown in FIG. 4, method 400 includes performing the following processes in an erase and program cycle:

S401: Read data in the first and second data areas to determine data status in the first and second data areas;

S402: Determine that data in one of the data areas is complete and data in the other area is erased;

S403: Perform a program operation in the data area that is erased.

For example, if data in the first data area is complete and the second data area is in an erased state, then the system performs a program operation in the second data area.

Figure 5:
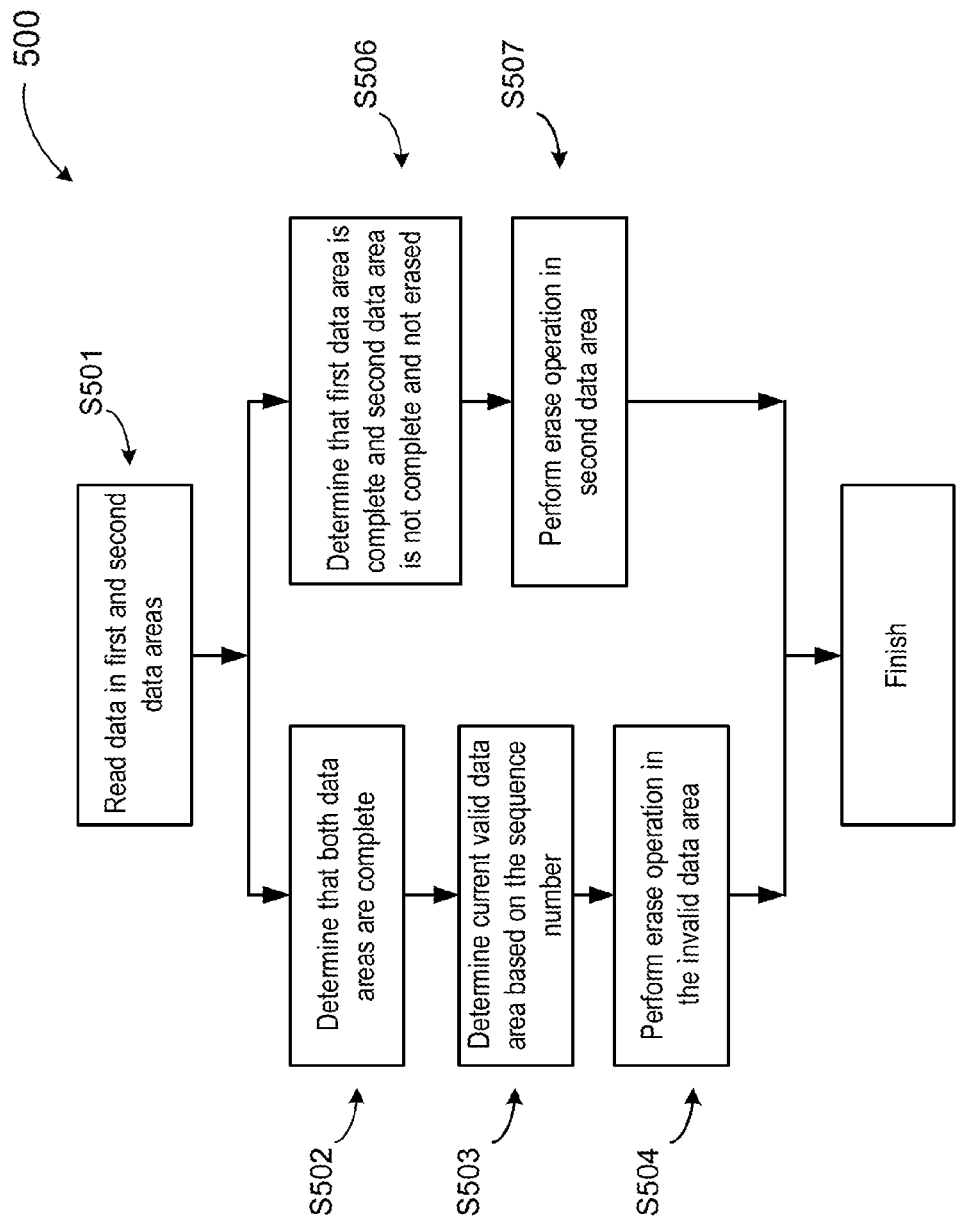
FIG. 5 is a flowchart illustrating another data storage method according to an embodiment of the present invention.

FIG. 5 is flowchart illustrating a data storage method according to an embodiment of the present invention. As shown in FIG. 5, in some embodiments, method 500 include the following processes in an erase and program cycle:

S501: Read data in the first and second data areas to determining data status in the first and second data areas;

S502: After S501, the system determines that both data areas are complete;

S503: Determine current valid data area based on the sequence number;

S504: Perform an erase operation in the invalid area, which is not the valid area;

S506: After S501, the system determines that the first data area is complete and the second data area is not complete and not erased;

S507: Perform an erase operation in the second data area.

Figure 6:
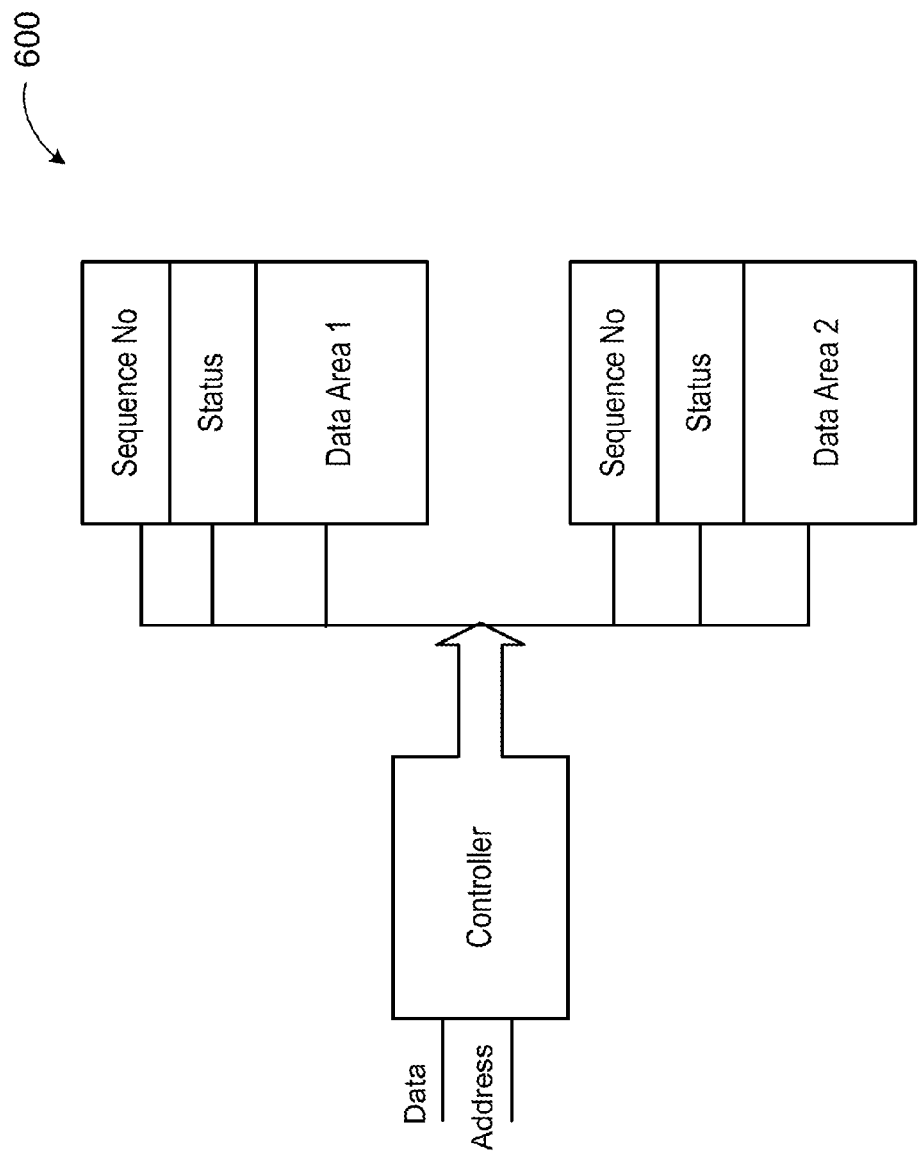
FIG. 6 is a simplified block diagram illustrating an EEPROM device according to an embodiment of the present invention.

FIG. 6 is a simplified block diagram illustrating an EEPROM device according to an embodiment of the present invention. As shown in FIG. 6, an electrically erasable programmable read-only memory (EEPROM) device 600 includes a plurality of data areas associated with a corresponding plurality of memory addresses, respectively. For example, the plurality of data areas can include Data Area 1 and Data Area 2 in FIG. 6. The EEPROM device also includes a data status indicator associated with each of the plurality of data areas. The data status indicators are configured to indicate that a data area is one of several states, e.g., an erase state, an uncertain state, or a valid state. The EEPROM device also includes a sequence number associated with each of the plurality of data areas. Further, the EEPROM device also includes a controller, which is configured to receive input data and an address for storing the data in the data areas.

In EEPROM device 600, data area 1 and data area 2 are configured to be a backup storage area for each other. As described in FIGS. 3-5, in erase-program cycle #1, a program operation is performed to store data into data area 1. After the program operation is finished, the data is in a valid state in data area 1. Then, an erase operation is performed in data area 2. Note that, in the beginning of erase-program cycle #1, data area 1 is in an erased state, and data area 2 is in a valid state. Further, data area 1 is in a valid state, when data area 2 undergoes the erase operation. Note that, in some embodiments, the system includes a data completion test module for determining whether a data area is in an uncertain state or a valid state. The module can be configured to determine if a program operation is completed to determine if the data is valid.

In erase-program cycle #2, a program operation is performed to store data into data area 2. After the program operation is finished, the data is in a valid state in data area 2. Then, an erase operation is performed in data area 1. Note that in the beginning of erase-program cycle #2, data area 2 is in an erased state after having been erased in a previous cycle, and data area 1 is in a valid state after being programmed in the previous cycle. Further, data area 2 is in a valid state, when data area 1 undergoes the erase operation.

In some embodiments, EEPROM device 600 is also configured to carry out the methods described above in connection with the flowcharts in FIGS. 4 and 5. For example, FIG. 4 is flowchart illustrating a data storage method according to an embodiment of the present invention. The EEPROM device is configured to carry out method 400 as shown in FIG. 4.

Method 400 includes performing the following processes in an erase and program cycle:

S401: Read data in the first and second data areas to determining data status in the first and second data areas;

S402: Determine that data in one of the data areas is complete and data in the other area is erased.

S403: Perform a program operation in the data area that is erased.

For example, if data in the first data area is complete and the second data area is in an erased state, then the system performs a program operation in the second data area.

In some embodiments, the EEPORM device is also configured to carry out method 500 as shown in FIG. 5. FIG. 5 is flowchart illustrating a data storage method according to an embodiment of the present invention. As shown in FIG. 5, in some embodiments, method 500 includes the following processes in an erase and program cycle:

S501: Read data in the first and second data areas to determine data status in the first and second data areas;

S502: After S501, the system determines that both data areas are complete;

S503: Determine current valid data area based on the sequence number;

S504: Perform an erase operation in the invalid area, which is not the valid area;

S506: After S501, the system determines that the first data area is complete and the second data area is not complete and not erased;

S507: Perform an erase operation in the second data area.

As described above, one of the data areas is always in a valid state, when the other data area is undergoing a program or an erase operation. Only one erase and program cycle is needed to update the data once. In contrast, in the conventional method, two erase and program cycles are needed to store a new data and back it up.

Those skilled in the art should understand that the above-described modules or steps of the embodiments may be designed using simulation in a general purpose computing device. The circuit components can be made into respective integrated circuit modules, or in a plurality of modules made into a single integrated circuit.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. An electrically erasable programmable read-only memory (EEPROM) device, comprising:
   a plurality of data areas in the EEPROM associated with a corresponding plurality of memory addresses, respectively;
   a data status indicator associated with each of the plurality of data areas, the data status indicator configured to indicate that a data area is in an erase state, an uncertain state, or a valid state; and
   a controller;
   wherein a first data area and a second data area are configured to be a backup storage area for each other;
   wherein, in an erase and program cycle, at least one of the first or second memory areas is in a valid state throughout the erase and program cycle; and
   wherein, in an erase and program cycle, an erase operation is performed in one of the first or second memory areas, and a program operation is performed in the other data areas.

2. The EEPROM device of claim 1, wherein the EEPROM device is configured such that:
   during an erase operation, a data area is in an uncertain state and after completion of the erase operation, the data area is in an erased state; and
   during a program operation, the data area is in an uncertain state and after completion of the program operation, the data area is in a valid state;
   wherein the EEPROM device is further configured to, in a single erase and program cycle:
      perform a program operation in a first data area that is in an erase state; and
      after the program operation is completed, perform an erase operation in a second data area that is in a valid state;
   wherein the EEPROM is configured such that at least one of the first or second memory areas is in a valid state throughout the single erase and program cycle.

3. The EEPROM device of claim 2, wherein the EEPROM device is configured to perform the following operations, in a first erase and program cycle:
   determining that a first data area is in an erased state and a second data area is in a valid state;
   performing a program operation to store a first data in the first data area;
   after completion of the program operation, setting the first data area to a valid state, and performing an erase operation in the second data area; and
   after completion of the erase operation, setting the second data area to an erased state.

4. The EEPROM device of claim 3, wherein the EEPROM device is configured to perform the following operations, in a second erase and program cycle after the first erase and program cycle:
   performing a program operation to store a second data in the second data area;
   after completion of the program operation, setting the second data area to a valid state, and performing an erase operation in the first data area; and
   after completion of the erase operation, setting the first data area to an erased state.

5. The EEPROM device of claim 2, further comprising a sequence number associated with each of a plurality of data areas, wherein the EEPROM device is configured to perform the following operations:
   determining that both first and second data areas are in a valid state;
   examining the sequence number in each of the first and second data areas to select one of the first or second data areas; and
   performing an erase operation in the selected data area.

6. The EEPROM device of claim 2, wherein the EEPROM device is configured to perform the following operations:
   determining that an operation in a data area is not completed and that the data area is not in an erased state; and
   performing an erase operation in that data area.

7. The EEPROM device of claim 2, wherein the EEPROM device is configured to determine if an erase operation or programming operation is completed.

8. A method for operating an electrically erasable programmable read-only memory (EEPROM), comprising:
   providing a plurality of data areas in the EEPROM associated with a corresponding plurality of memory addresses, respectively, wherein, during an erase operation a data area is in an uncertain state and, after completion of the erase operation, the data area is in an erased state, and wherein during a program operation, the data area is in an uncertain state and after completion of the program operation, the data area is in a valid state;
   wherein the method further comprises, in a first erase and program cycle:
   determining that a first data area is in an erased state and a second data area is in a valid state;
   performing a program operation to store a first data in the first data area;
   after completion of the program operation, setting the first data area to a valid state, and performing an erase operation in the second data area;
   after completion of the erase operation, setting the second data area to an erased state; and
   wherein the first data area and the second data area are configured to be a backup data storage area to each other.

* * * * *